(12) United States Patent
Hashiguchi

(10) Patent No.: US 9,869,915 B2
(45) Date of Patent: Jan. 16, 2018

(54) ARRAY SUBSTRATE AND LIQUID CRYSTAL DISPLAY PANEL INCLUDING THE SAME

(71) Applicant: Mitsubishi Electric Corporation, Tokyo (JP)

(72) Inventor: Takafumi Hashiguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/877,618

(22) Filed: Oct. 7, 2015

(65) Prior Publication Data

US 2016/0103378 A1    Apr. 14, 2016

(30) Foreign Application Priority Data

Oct. 9, 2014  (JP) ................................. 2014-207730

(51) Int. Cl.
G02F 1/1345 (2006.01)
G02F 1/1362 (2006.01)
H01L 27/12 (2006.01)

(52) U.S. Cl.
CPC .. G02F 1/136286 (2013.01); G02F 1/136227 (2013.01); H01L 27/124 (2013.01); G02F 1/1345 (2013.01); G02F 2001/136254 (2013.01)

(58) Field of Classification Search
CPC ............. G02F 1/136227; G02F 1/1345; G02F 2001/136254–2001/136272; G02F 1/136259–1/136286; H05K 999/00
See application file for complete search history.

(56) References Cited

U.S. PATENT DOCUMENTS

| 6,784,949 | B1 | 8/2004 | Nagata et al. |
| 7,250,991 | B2 | 7/2007 | Nagata et al. |
| 2003/0234904 | A1* | 12/2003 | Matsuda ............... G02F 1/1345 349/152 |
| 2004/0095549 | A1* | 5/2004 | Moon .................... G02F 1/1345 349/192 |
| 2005/0041191 | A1* | 2/2005 | Lim .................. G02F 1/136227 349/152 |

(Continued)

FOREIGN PATENT DOCUMENTS

| JP | 2000-323698 A | 11/2000 |
| JP | 2002-098992 A | 4/2002 |
| JP | 2008-233730 A | 10/2008 |

*Primary Examiner* — Michael Caley
*Assistant Examiner* — Jonathan Y Jung
(74) *Attorney, Agent, or Firm* — Studebaker & Brackett PC

(57) ABSTRACT

An array substrate according to the present invention is an array substrate including a display region that displays an image and a frame region. The array substrate includes: a plurality of scanning lines; a plurality of signal lines; a thin film transistor disposed at an intersection of each of the plurality of scanning lines and each of the plurality of signal lines; a plurality of in-frame wires formed in the frame region; and a plurality of connection converters that electrically connect the scanning lines or the signal lines to the in-frame wires and are provided in the frame region. A single contact hole that penetrates an insulating layer is formed in each of the connection converters, and each of the scanning lines or each of the signal lines is electrically connected with each of the in-frame wires through a conductive film in the single contact hole.

10 Claims, 7 Drawing Sheets

(56) References Cited

U.S. PATENT DOCUMENTS

| | | | | |
|---|---|---|---|---|
| 2009/0243972 | A1* | 10/2009 | Her | G09G 5/00 |
| | | | | 345/55 |
| 2011/0291097 | A1* | 12/2011 | Ogasawara | G02F 1/1339 |
| | | | | 257/59 |
| 2012/0293471 | A1* | 11/2012 | Yoshida | G02F 1/13454 |
| | | | | 345/205 |
| 2013/0235292 | A1* | 9/2013 | Hara | G02F 1/136213 |
| | | | | 349/41 |

* cited by examiner

ARRAY SUBSTRATE AND LIQUID CRYSTAL DISPLAY PANEL INCLUDING THE SAME

BACKGROUND OF THE INVENTION

Field of the Invention

The present invention relates to an array substrate and a liquid crystal display panel including the array substrate, and more particularly, to a liquid crystal display panel capable of performing an inspection before mounting an integrated circuit (IC) chip (or a large scale integrated (LSI) circuit chip) in a chip-on-glass (COG) liquid crystal display panel without expanding a frame region.

Description of the Background Art

In COG liquid crystal display panels, array substrates including liquid crystal driving wires have extending portions to be longer than color filter substrates disposed opposite to the array substrates. The extending portions include regions in which IC chips are mounted. Further, various wires are led to the IC chip mounted regions to form bump terminals that are connected with bump terminals of the IC chips. Thus, the IC chips control driving of liquid crystals.

In the COG liquid crystal display panels, the presence or absence of breaks in the various wires or short circuits between the wires is inspected in a manufacturing step. The wires led to the IC chip mounted regions are used to perform this inspection before the IC chips are mounted on the array substrates. More specifically, the inspection is typically performed by using a so-called pin probe mode that contacts conductive contact pins to the bump terminals provided on the various wires.

However, contact of the conductive contact pins with the bump terminals may scratch the bump terminals, and the contact thereof with the adjacent terminals may cause electrolytic corrosion of the bump terminals. Thus, a method for solving the above-mentioned problems is considered (for example, see Japanese Patent Application Laid-Open No. 2008-233730).

A liquid crystal display disclosed in Japanese Patent Application Laid-Open No. 2008-233730 includes terminal electrode wires further from an output electrode pad (bump terminal) connected with scanning lines or signal lines and includes inspection terminals formed at end portions of the terminal electrode wires. The inspection electrode pad includes the adjacent inspection terminals arranged alternately in two rows.

However, with requests for a narrow frame and a low cost of a liquid crystal display panel in recent times, a multiple-output IC chip is applied for the purpose of reducing the size and the number of IC chips, which also causes an IC chip mounted region to be narrow. Consequently, a special-purpose inspection terminal is hardly provided.

Then, signal lines or scanning lines that are common for an inspection are provided in a non-display region of a liquid crystal display panel, each of signal lines or each of scanning lines in a display region is connected with an inspection wire through an inspection thin-film transistor, and an inspection terminal is provided in each of the signal lines or each of the scanning lines that are common for the inspection. This method capable of easily performing an inspection at low cost with few inspection terminals that are not in contact with bump terminals in an IC chip mounted region is known (for example, see Japanese Patent Application Laid-Open No. 2002-98992).

However, in an inspection in the liquid crystal display panel disclosed in Japanese Patent Application Laid-Open No. 2002-98992, a break or a short circuit in the signal line or the scanning line or a point defect in a display region is found after an array substrate has been bonded to a color filter substrate (hereinafter may be referred to as a CF substrate) being a counter substrate and a display has been checked. In other words, a loss cost of the non-defective CF substrate occurs. A recent repair technology is brought into full use to repair the break or the defective portion, but the signal lines or the scanning lines are collectively connected with the inspection wire, so that an address of the faulty portion cannot be detected.

In the liquid crystal display panel disclosed in Japanese Patent Application Laid-Open No. 2002-98992, the inspection terminal is newly provided on each of the signal lines or each of the scanning lines and needs to be provided in a frame region because the IC chip mounted region is narrow. In this case, it is feared that corrosion of the terminal or an entry of static electricity causes display failures. Thus, the inspection terminals need to be disposed in a seal and close to the display region. However, the frame region is expanded by the area of the seal including the inspection terminals, so that it is difficult to narrow the frame. When the inspection terminals are disposed close to the display region, an increase in an area that exposes each potential from the inspection terminal in each of the signal lines or each of the scanning lines causes accumulation of electric charge on the counter substrate side, affecting alignment of liquid crystals in the display region. Thus, it is feared that peripheral unevenness of the display occurs.

SUMMARY OF THE INVENTION

It is an object of the present invention to provide an array substrate capable of performing an inspection for breaks in wires without expanding a frame region and to provide a liquid crystal display panel including the array substrate.

An array substrate according to the present invention is an array substrate including a display region that displays an image and a frame region that surrounds the display region. The array substrate includes a plurality of scanning lines that are formed in parallel in the display region and are extended to the frame region and a plurality of signal lines that are formed to intersect the plurality of scanning lines, are formed to be in parallel in the display region, and are extended to the frame region. The array substrate includes a thin film transistor disposed at an intersection of each of the plurality of scanning lines and each of the plurality of signal lines. The array substrate includes a plurality of in-frame wires formed in the frame region and an insulating layer that vertically separates the scanning lines and the signal lines from the in-frame wires in the frame region. The array substrate includes a plurality of connection converters that electrically connect the scanning lines or the signal lines to the in-frame wires and are provided in the frame region. A single contact hole that penetrates the insulating layer is formed in each of the connection converters, and each of the scanning lines or each of the signal lines is electrically connected with each of the in-frame wires through a conductive film in the single contact hole.

The single contact hole is provided in the connection converter, so that a terminal of an inspection device can be in contact with the scanning line or the signal line through the contact hole. In other words, an inspection for breaks can be performed by using the connection converter without the inspection terminal in the array substrate. Consequently, the expansion of the frame region in the array substrate can be suppressed, and the narrow-framed liquid crystal display panel can be obtained.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>
<Configuration>

Figure 1:
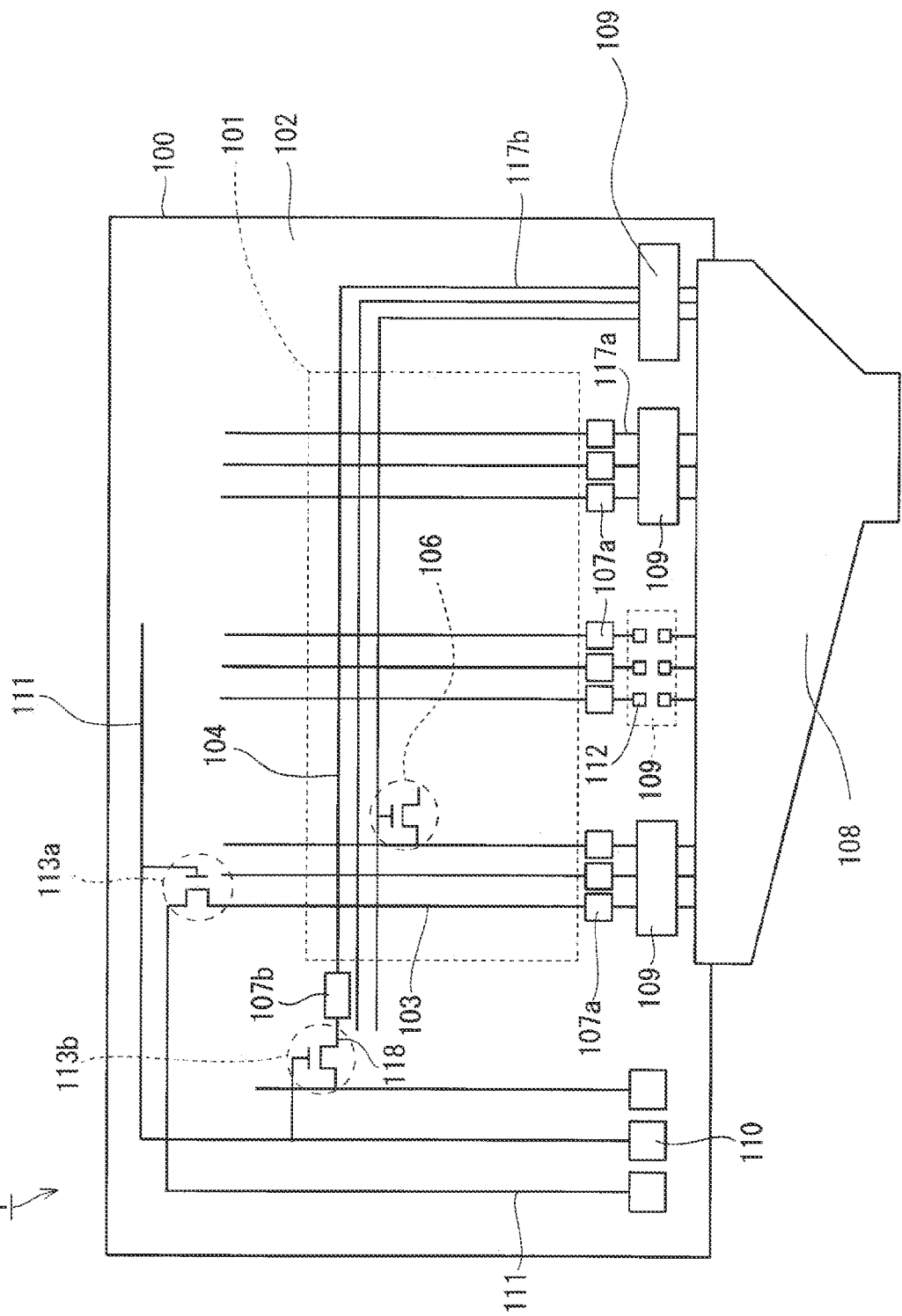
FIG. 1 is a plan view of an array substrate according to a first preferred embodiment.

FIG. 1 is a plan view of an array substrate 1 in a first preferred embodiment. FIG. 1 is a schematic diagram and does not reflect accurate sizes of structural components being shown. In addition, FIG. 1 omits portions except for main part of the present invention and partially simplifies the configuration as appropriate for the sake of brevity. This applies to the drawings below. Further, in the drawings below, the same structural components as those described in the diagram that has been already mentioned are denoted by the same references, and the descriptions are omitted here.

The array substrate 1 includes, for example, each wire and a thin film transistor that are described below on a transparent insulating substrate 100 (hereinafter may be referred to as an insulating substrate). In the array substrate 1, a display region 101 that displays an image and a frame region 102 that surrounds the display region 101 are defined.

As shown in FIG. 1, the array substrate 1 includes a plurality of scanning lines 104. The plurality of scanning lines 104 are formed in parallel in the display region 101 and are extended to the frame region 102. The array substrate 1 includes a plurality of signal lines 103. The plurality of signal lines 103 are formed to intersect the plurality of scanning lines 104, are formed to be in parallel in the display region 101, and are extended to the frame region 102. As shown in FIG. 1, the array substrate 1 includes a thin film transistor 106 disposed at an intersection of each of the plurality of scanning lines 104 and each of the plurality of signal lines 103. A plurality of common wires are disposed in the array substrate 1, but FIG. 1 does not show them for making the diagram easy to see.

The signal lines 103 disposed in the display region 101 of the array substrate 1 are each extended to the frame region 102 of the array substrate 1. A plurality of connection converters 107a are provided in the frame region 102 of the array substrate 1 correspondingly to the signal lines 103. In the frame region 102 of the array substrate 1, a plurality of terminal electrodes 112 and in-frame wires 117a each connected with the corresponding terminal electrode 112 are provided. In the frame region 102, the signal lines 103 and the in-frame wires 117a are separated vertically by an insulating layer 3. The connection converter 107a electrically connects each of the signal lines 103 to each of the in-frame wires 117a. The terminal electrodes 112 are electrically connected with an IC chip 109 through an anisotropic conductive film (ACF) and a bump. The IC chip 109 is electrically connected with a print substrate 108.

The scanning lines 104 disposed in the display region 101 of the array substrate 1 are each extended to the frame region 102 of the array substrate 1. A plurality of connection converters 107b are provided in the frame region 102 of the array substrate 1 correspondingly to the scanning lines 104. In the frame region 102 of the array substrate 1, a plurality of inspection thin-film transistors 113b and in-frame wires 118 each connected with a source electrode of the corresponding inspection thin-film transistors 113b are provided. An inspection terminal 110 is provided on each of inspection signal lines 111. In the frame region 102, the scanning lines 104 and the in-frame wires 118 are separated vertically by the insulating layer 3. The connection converter 107b electrically connects each of the scanning lines 104 to each of the in-frame wires 118.

An end of each of the signal lines 103 is connected with the inspection signal line 111 through an inspection thin-film transistor 113a, the end being opposite to an end in which the IC chip 109 is disposed.

An end of each of the scanning lines 104 is connected with the IC chip 109 through an in-frame wire 117b, the end being opposite to an end in which the inspection thin-film transistor 113b is disposed.

Figure 2:
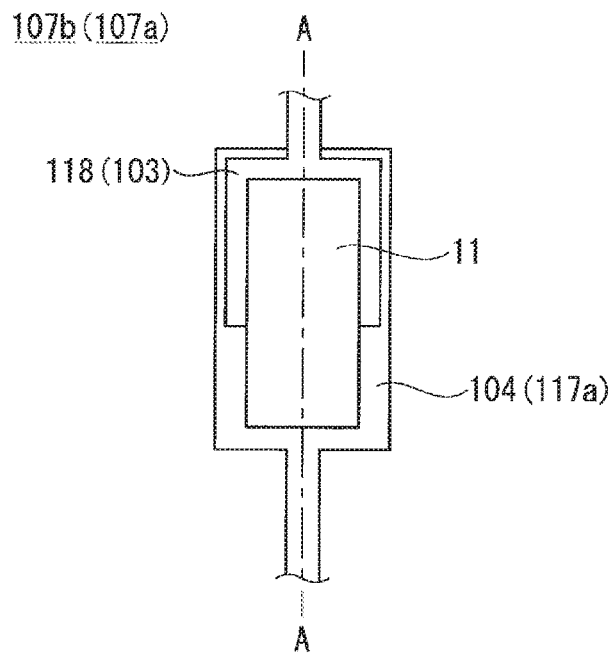
FIG. 2 is a plan view of a connection converter according to the first preferred embodiment.
Figure 3:
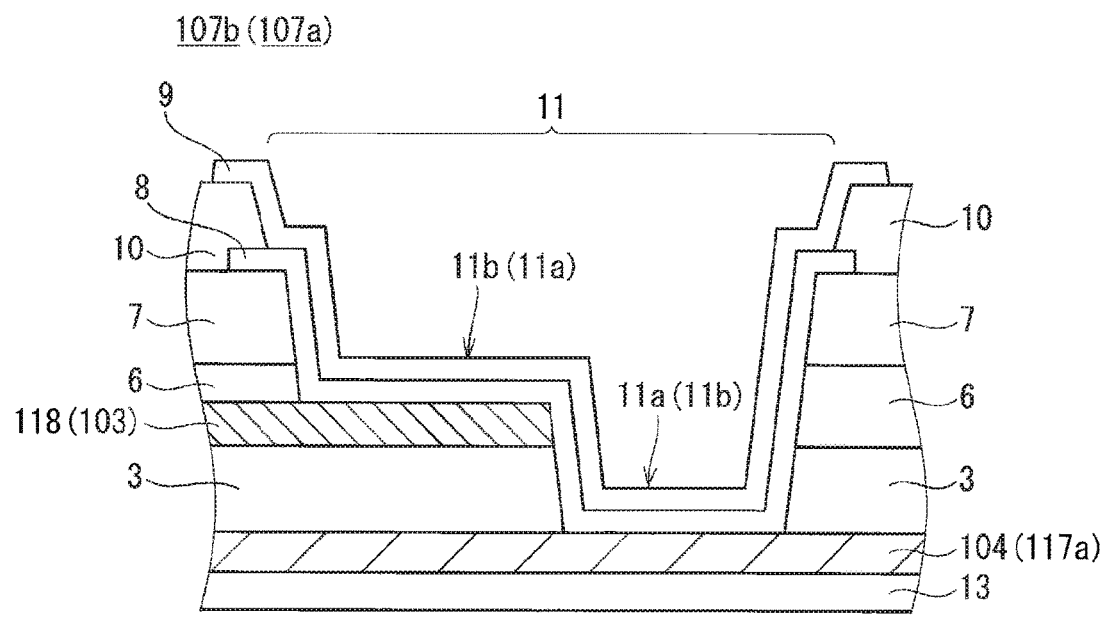
FIGS. 3 and 4 are cross-sectional views of the connection converter according to the first preferred embodiment.

FIG. 2 is a plan view of the connection converter 107b. FIG. 3 is a cross-sectional view taken along a line segment A-A in FIG. 2. A single contact hole 11 is formed so as to extend over the scanning line 104 and the in-frame wire 118 extending from the source electrode of the inspection thin-film transistor 113b. As shown in FIG. 3, the scanning line 104 is formed on an insulating substrate 13. The in-frame wire 118 is formed on the scanning line 104 through the insulating layer 3. An interlayer insulating film 6 is formed on the in-frame wire 118 and the insulating layer 3. A planarized film 7 and a protective film 10 are formed on the interlayer insulating film 6. The connection converters 107a, 107b each have the single contact hole 11 that penetrates the insulating layer 3. The scanning line 104 is electrically connected with the in-frame wire 118 through a conductive film (lower transparent conductive film 8 and upper transparent conductive film 9) formed in the contact hole 11.

In the connection converter 107b, the contact hole 11 has a first horizontal region 11a in which a first bottom of the contact hole 11 is in contact with the scanning line 104 and has a second horizontal region 11b in which a second bottom of the contact hole 11 is in contact with the in-frame wire 118. In the first preferred embodiment, a sum of an area of the first horizontal region 11a and an area of the second horizontal region 11b is 3000 µm² or more. In other words, in FIG. 3, it is assumed that a sum of a length of the first horizontal region 11a in a lateral direction of a paper plane and a length of the second horizontal region 11b in the lateral direction of the paper plane is 100 µm or more, and a sum of a length of the first horizontal region 11a in a depth direction of the paper plane and a length of the second horizontal region 11b in the depth direction of the paper plane is 30 µm or more.

Figure 4:
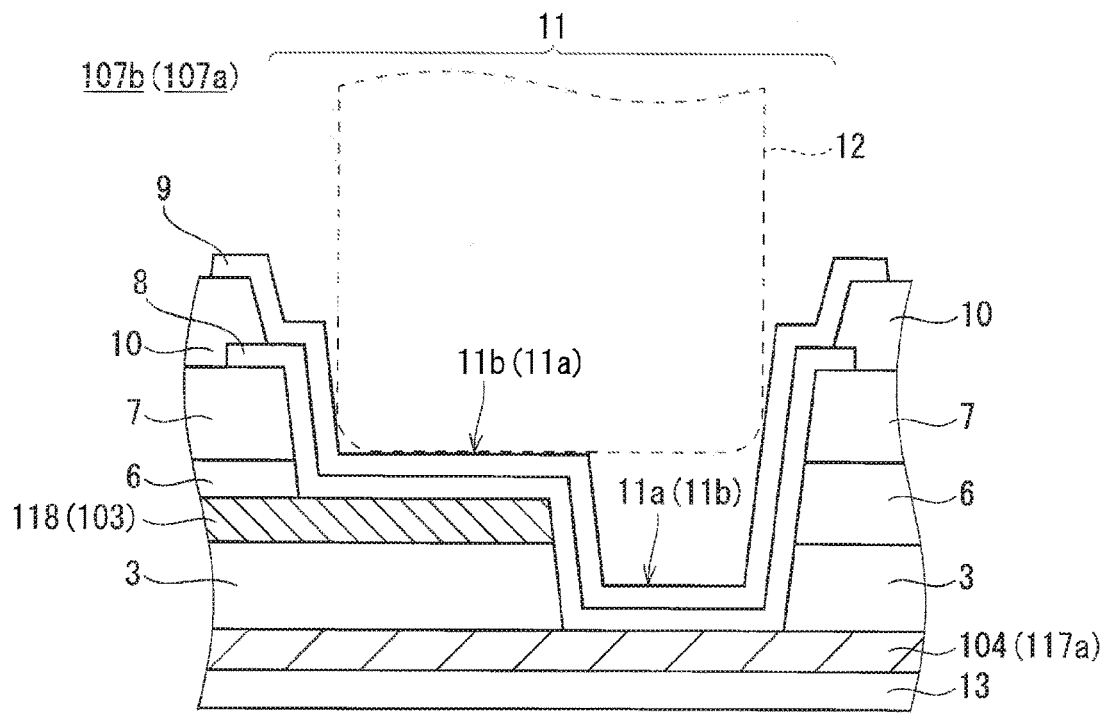

The contact hole 11 has the dimension described above, so that a terminal 12 of an inspection device can be inserted in the contact hole 11 upon an inspection for breaks, as shown in FIG. 4. Thus, sufficient contact between the connection converter 107b and the terminal 12 of the inspection device can be obtained.

Moreover, the references in the parentheses in FIGS. 2 and 3 correspond to the references of the connection converter 107a. The single contact hole 11 is also formed to extend over the signal line 103 and the in-frame wire 117a in the connection converter 107a. As shown in FIG. 3, the single contact hole 11 penetrates the insulating layer 3. The signal line 103 is electrically connected with the in-frame wire 117a through the conductive film (lower transparent conductive film 8 and upper transparent conductive film 9) formed in the contact hole 11. As shown in FIGS. 2 and 3, a difference between the connection converter 107b and the connection converter 107a is that the in-frame wire 118 and the scanning line 104 are replaced by the signal line 103 and the in-frame wire 117a, respectively. The configuration except for this is the same as the connection converter 107b, so that descriptions of the connection converter 107a are omitted.

A liquid crystal display panel in the first preferred embodiment includes the array substrate 1 described above, a color filter substrate opposed to the array substrate 1, and liquid crystals held between the array substrate 1 and the color filter substrate.

<Manufacturing Method>

The steps of manufacturing the connection converter 107b (FIG. 3) are described while taking the liquid crystal display panel of an FFS mode including the array substrate 1 according to the first preferred embodiment as an example.

First, a conductive metal film that is to be the scanning lines 104 and gate electrodes of the thin film transistors 106 and the inspection thin-film transistors 113a, 113b is formed on the insulating substrate 13. Then, after a pattern is formed by photolithography or the like, the gate insulating film (insulating layer 3) that is to be an insulating film is formed by CVD or the like on the scanning lines 104 and the gate electrodes.

Next, after the semiconductor layer is formed, a conductive metal film that is to be the signal lines 103 and source electrodes and drain electrodes of the thin-film transistors 106 and the inspection thin-film transistors 113a, 113b is formed. Then, a pattern is formed by the photolithography or the like. Consequently, the thin-film transistors 106 in the display region 101 and the inspection thin-film transistors 113a, 113b in the frame region 102 are formed.

Next, the interlayer insulating film 6 that is to be an insulating film is formed by the CVD or the like on the in-frame wires 118 (source electrodes of the inspection thin-film transistors 113b) and the signal lines 103. Further, the planarized film 7 formed of an organic film or the like is formed to suppress abnormal alignment of the liquid crystals due to a step height of the various wires. For example, an organic resin film mainly containing acryl resin or a spin-on-glass (SOG) film is used for the planarized film 7. At this time, a photosensitive organic resin film is used for the planarized film 7 and a photolithography step is performed thereon, to thereby form a pattern that is to be the contact hole 11 in the planarized film 7. Plasma etching with the planarized film 7 as a mask is performed, to thereby form the contact hole 11 in the gate insulating film (insulating layer 3) and the interlayer insulating film 6.

Next, the lower transparent conductive film 8 formed of a transparent conductive film such as IZO and ITO, the protective film 10 formed of an SiN film, and the upper transparent conductive film 9 formed of a transparent conductive film such as the IZO and the ITO are formed in the stated order on the planarized film 7.

The contact hole formed in the interlayer insulating film 6 and the gate insulating film (insulating layer 3) using the previous planarized film 7 as a mask and the contact hole formed in the protective film 10 by dry etching using plasma form the single contact hole 11. Each of the in-frame wires 118 is electrically connected with each of the scanning lines 104 through the conductive film (lower transparent conductive film 8 and upper transparent conductive film 9) formed in the contact hole 11.

Figure 12:
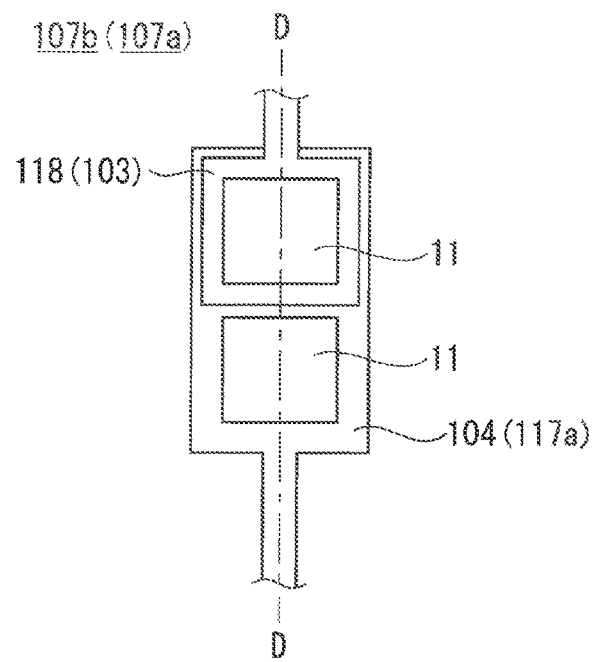
FIG. 12 is a plan view of a connection converter according to a prerequisite technology.
Figure 13:
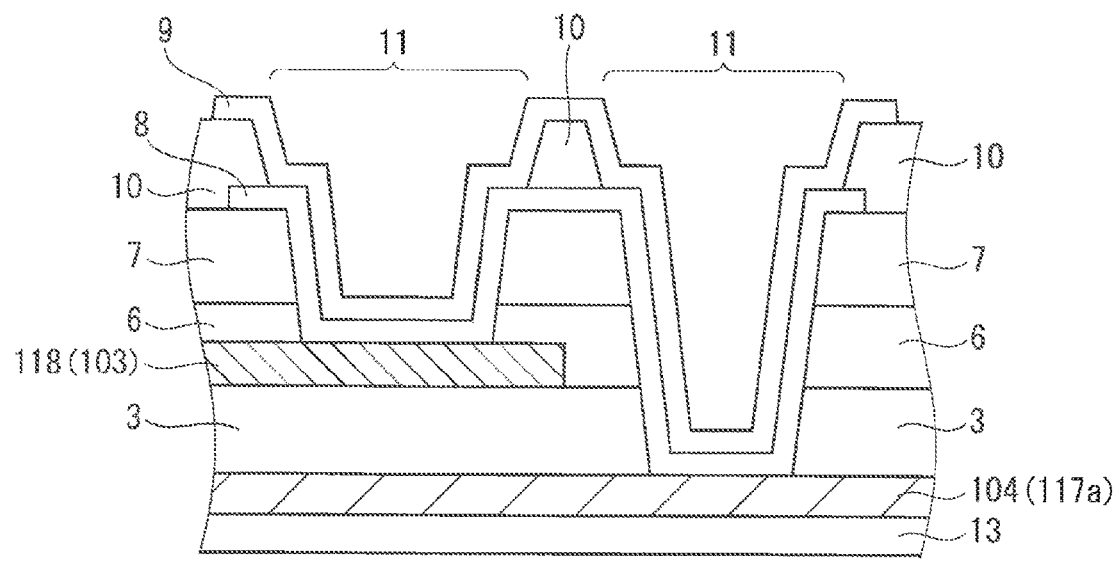
FIG. 13 is a cross-sectional view of the connection converter according to the prerequisite technology.

FIG. 12 is a plan view of the connection converter 107b (or 107a) in a prerequisite technology of the present invention. FIG. 13 is a cross-sectional view taken along a line segment D-D in FIG. 12. As shown in FIGS. 12 and 13, in the prerequisite technology, two contact holes 11 are provided in each of the connection converters 107a, 107b. In other words, the two contact holes 11 are separated on the signal line 103 side and on the in-frame wire 117a side in the connection converter 107a. In the connection converter 107b, the two contact holes 11 are separated on the in-frame wire 118 side and on the scanning line 104 side.

On the other hand, the connection converters 107a, 107b in the first preferred embodiment each include the single contact hole 11 that is not separated into two. With the single contact hole 11, the terminal 12 of the inspection device can be sufficiently in contact with the scanning line 104 or the signal line 103. Thus, the connection converters 107a, 107b can be employed as the inspection terminals.

<Effects>

The array substrate 1 in the first preferred embodiment includes the display region 101 that displays an image and the frame region 102 that surrounds the display region 101. The array substrate 1 includes: the plurality of scanning lines 104 that are formed in parallel in the display region 101 and are extended to the frame region 102; the plurality of signal lines 103 that are formed to intersect the plurality of scanning lines 104, are formed to be in parallel in the display region 101, and are extended to the frame region 102; the thin film transistor 106 disposed at the intersection of each of the plurality of scanning lines 104 and each of the plurality of signal lines 103; the plurality of in-frame wires 117a, 118 formed in the frame region 102; the insulating layer 3 that vertically separates the scanning lines 104 and the signal lines 103 from the in-frame wires 117a, 118 in the frame region 102; and the plurality of connection converters 107a, 107b that electrically connect the scanning lines 104 or the signal lines 103 to the in-frame wires 117a, 118 and are provided in the frame region 102. The single contact hole 11 that penetrates the insulating layer 3 is formed in each of the connection converters 107a, 107b, and each of the scanning lines 104 or each of the signal lines 103 is electrically connected with each of the in-frame wires 117a, 118 through the conductive film in the single contact hole 11.

Therefore, in the first preferred embodiment, the connection converters 107a, 107b each have the single contact hole 11, allowing the terminal 12 of the inspection device to be in contact with each of the scanning lines 104 or each of the signal lines 103. Thus, the connection converters 107a, 107b can be employed as the inspection terminals. In other words, in the first preferred embodiment, an inspection for breaks can be performed by using the connection converters 107a, 107b without forming the inspection terminals in the array substrate 1. Consequently, an expansion of the frame region 102 in the array substrate 1 can be suppressed, and the narrow-framed liquid crystal display panel can be obtained.

The single contact hole 11 in the array substrate 1 in the first preferred embodiment has: the first horizontal region 11a (or 11b) in which the first bottom of the single contact hole 11 is in contact with each of the scanning lines 104 or each of the signal lines 103; and the second horizontal region 11b (or 11a) in which the second bottom of the single contact hole 11 is in contact with each of the in-frame wires 117a, 118. The sum of the area of the first horizontal region 11a and the area of the second horizontal region 11b is 3000 µm² or more.

Therefore, the base area (namely, the sum of the area of the first horizontal region 11a and the area of the second horizontal region 11b) of the contact hole 11 each in the connection converters 107a, 107b is 3000 µm², so that the terminal 12 of the inspection device can be reliably in contact with the scanning line 104 or the signal line 103 by being inserted in the contact hole 11 with reliability.

The frame region 102 in the array substrate 1 in the first preferred embodiment includes the inspection thin-film transistors 113b or the IC chip 109. Each of the in-frame wires 117a, 118 is a wire connected with the electrode of each of the inspection thin-film transistor 113b or the electrode of the IC chip 109.

Therefore, each of the connection converters 107a and each of the connection converters 107b are respectively formed between the IC chip 109 and the signal line 103 and between the inspection thin-film transistor 113b and the scanning line 104 in the frame region 102, allowing the terminal 12 of the inspection device to be in contact with each of the connection converter 107a and the connection converter 107b. Thus, the array substrate 1 capable of performing an inspection for breaks in wires without expanding the frame region 102 can be obtained.

The liquid crystal display panel in the first preferred embodiment includes the array substrate 1, the color filter substrate opposed to the array substrate 1, and the liquid crystals held between the array substrate 1 and the color filter substrate.

Therefore, the array substrate 1 in the first preferred embodiment includes the connection converters 107a, 107b each serving as the terminal for performing the inspection for breaks, so that the area of the frame region 102 can be reduced. Consequently, the narrow-framed liquid crystal display panel including the narrow frame region 102 can be obtained.

<Second Preferred Embodiment>

Figure 5:
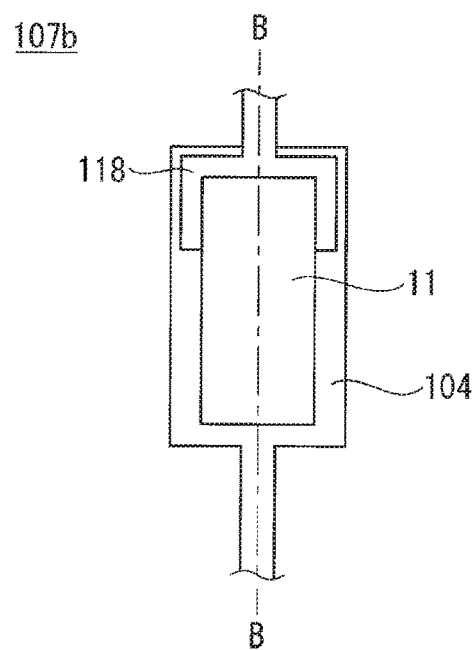
FIG. 5 is a plan view of a connection converter according to a second preferred embodiment.
Figure 6:
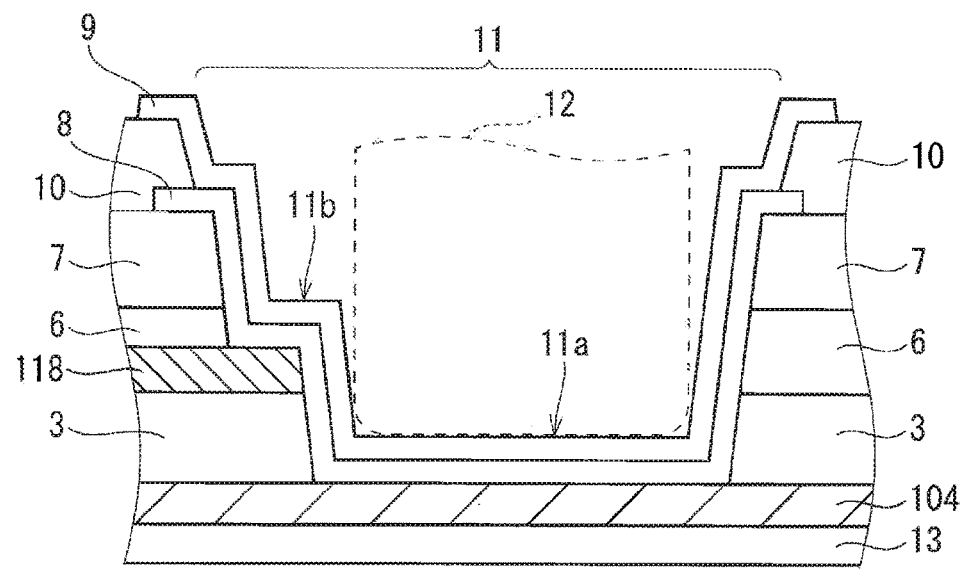
FIG. 6 is a cross-sectional view of the connection converter according to the second preferred embodiment.

FIG. 5 is a plan view of the connection converter 107b in a second preferred embodiment. FIG. 6 is a cross-sectional view taken along a line segment B-B in FIG. 5.

In the first preferred embodiment, the area of the first horizontal region 11a in which the first bottom of the contact hole 11 is in contact with the scanning line 104 is almost the same as the area of the second horizontal region 11b in which the second bottom of the contact hole 11 is in contact with the in-frame wire 118.

In the second preferred embodiment, an area of the first horizontal region 11a is different from an area of the second horizontal region 11b. For example, in the connection converter 107b as shown in FIG. 6, the area of the first horizontal region 11a is larger than the area of the second horizontal region 11b to ensure an excellent connection between the terminal 12 of the inspection device and the scanning line 104.

Figure 7:
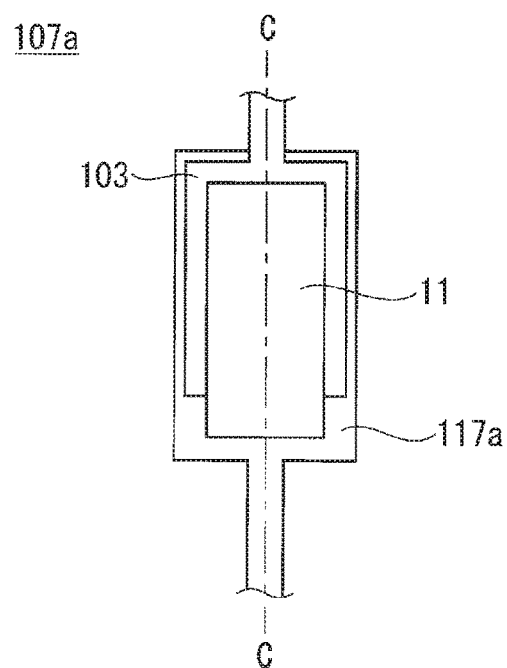
FIG. 7 is a plan view of a connection converter according to the second preferred embodiment.
Figure 8:
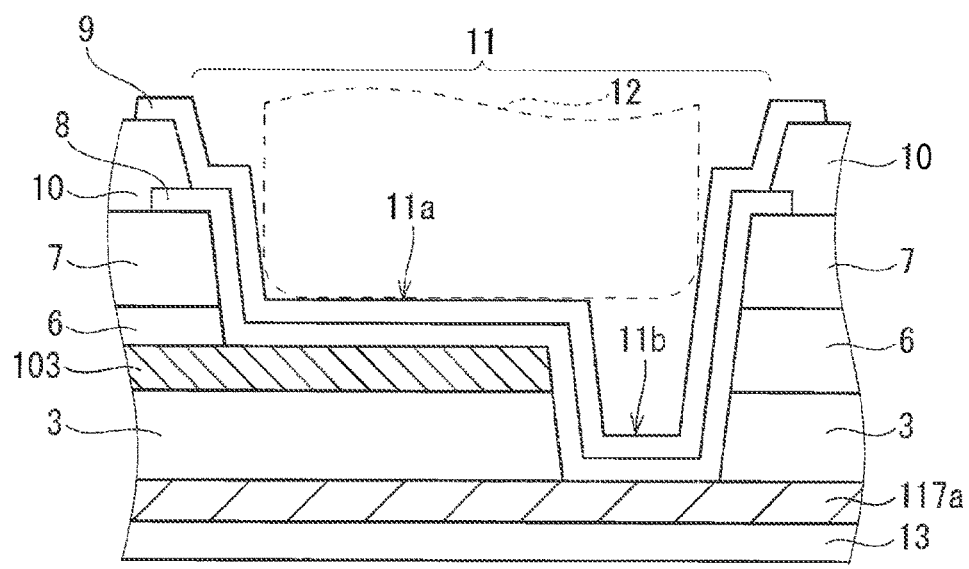
FIG. 8 is a cross-sectional view of the connection converter according to the second preferred embodiment.

FIG. 7 is a plan view of the connection converter 107a in the second preferred embodiment. FIG. 8 is a cross-sectional view taken along a line segment C-C in FIG. 7. In the second preferred embodiment, for example, in the connection converter 107a as shown in FIG. 8, an area of the first horizontal region 11a is larger than an area of the second horizontal region 11b to ensure an excellent connection between the terminal 12 of the inspection device and the signal line 103.

<Effects>

The single contact hole 11 in the array substrate 1 in the second preferred embodiment has: the first horizontal region 11a in which the first bottom of the single contact hole 11 is in contact with each of the scanning lines 104 or each of the signal lines 103; and the second horizontal region 11b in which the second bottom of the single contact hole 11 is in contact with each of the in-frame wires 117a, 118. The area of the first horizontal region 11a is different from the area of the second horizontal region 11b.

Therefore, for example, by increasing the area of the first horizontal region 11a larger than the area of the second horizontal region 11b, the terminal 12 of the inspection device can easily be in contact with the first horizontal region 11a, which can ensure the excellent contact between the terminal 12 of the inspection device and the scanning line 104 or the signal line 103.

In the array substrate 1 in the first preferred embodiment, the area of the first horizontal region 11a is larger than the area of the second horizontal region 11b. Therefore, for example, by increasing the area of the first horizontal region 11a larger than the area of the second horizontal region 11b, the terminal 12 of the inspection device can easily be in contact with the first horizontal region 11a, which can ensure the excellent contact between the terminal 12 of the inspection device and the scanning line 104 or the signal line 103.

<Third Preferred Embodiment>

Figure 9:
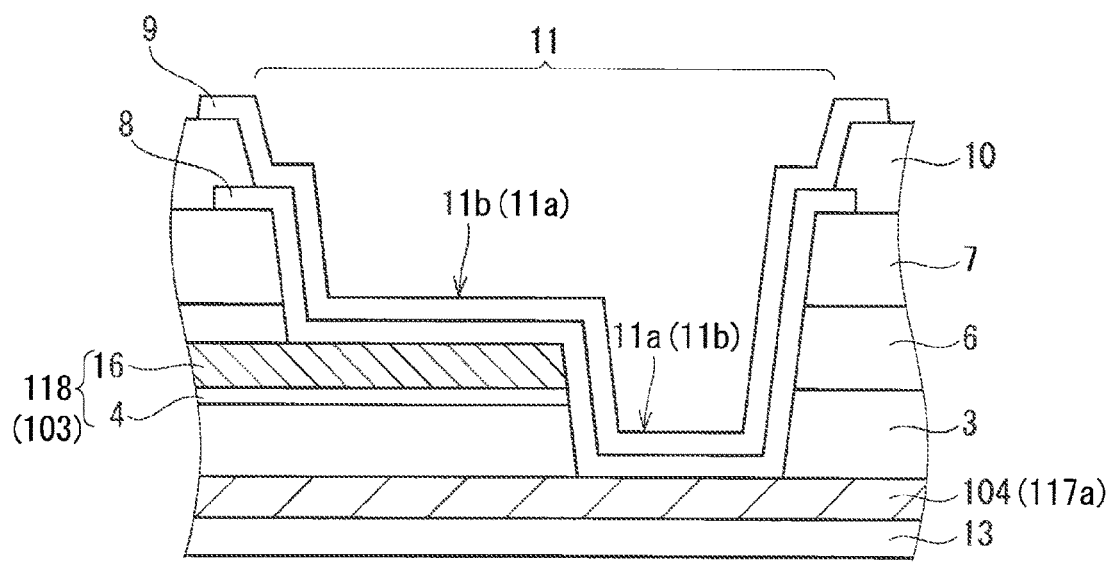
FIG. 9 is a cross-sectional view of a connection converter according to a third preferred embodiment.

FIG. 9 is a cross-sectional view of the connection converter 107b (or 107a) in a third preferred embodiment. As shown in FIG. 9, in the connection converter 107b, the in-frame wire 118 may have a laminated structure of a semiconductor layer 4 and a conductive film 16. In the connection converter 107a, the signal line 103 may have the laminated structure of the semiconductor layer 4 and the conductive film 16.

The in-frame wire 118 or the signal line 103 has the above-mentioned laminated structure, which still allows sufficient contact with the terminal 12 of the inspection device in the contact hole 11.

<Effects>

A wire formed in an upper layer among each of the scanning lines 104 or each of the signal lines 103 and each of the in-frame wires 118 is formed of the semiconductor layer 4 and the conductive film 16 laminated in the stated order.

Therefore, when the signal line 103 in the connection converter 107a or the in-frame wire 118 in the connection converter 107b has the laminated structure of the semiconductor layer 4 and the conductive film 16, the effects similar to those described in the first preferred embodiment can be obtained.

<Fourth Preferred Embodiment>

Figure 10:
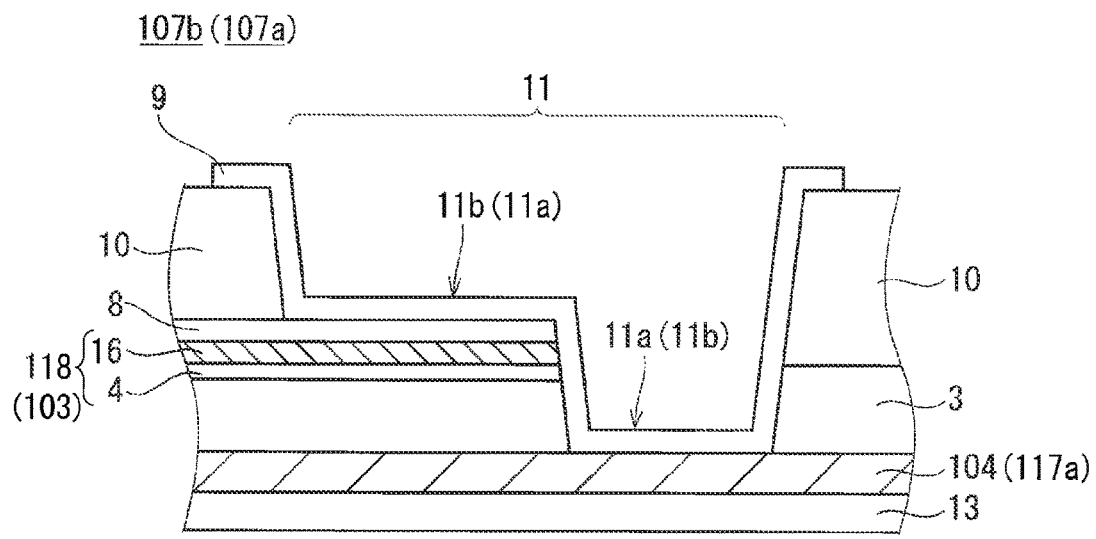
FIG. 10 is a cross-sectional view of a connection converter according to a fourth preferred embodiment.

FIG. 10 is a cross-sectional view of the connection converter 107b (or 107a) in a fourth preferred embodiment.

In the first preferred embodiment (FIG. 3), the contact hole 11 of the planarized film 7, the interlayer insulating film 6, and the gate insulating film 3 is coated with the lower transparent conductive film 8.

On the other hand, in the fourth preferred embodiment, the lower transparent conductive film 8 is laminated after the in-frame wire 118 (source electrode 5 of the inspection thin-film transistor 113b) is formed in the connection converter 107b or after the signal line 103 is formed in the connection converter 107a, to thereby form a pixel electrode (common electrode) in the FFS mode.

In other words, a wire formed in an upper layer among each of the scanning lines 104 or each of the signal lines 103 and each of the in-frame wires 117a, 118 is coated with the transparent conductive film (namely, the lower transparent conductive film 8).

This eliminates the need for forming the planarized film 7, allowing for a shortening of the manufacturing step. This also reduces a step portion of the upper transparent conductive film 9, so that electrical connections in the contact hole 11 can be more reliably maintained.

<Fifth Preferred Embodiment>

Figure 11:
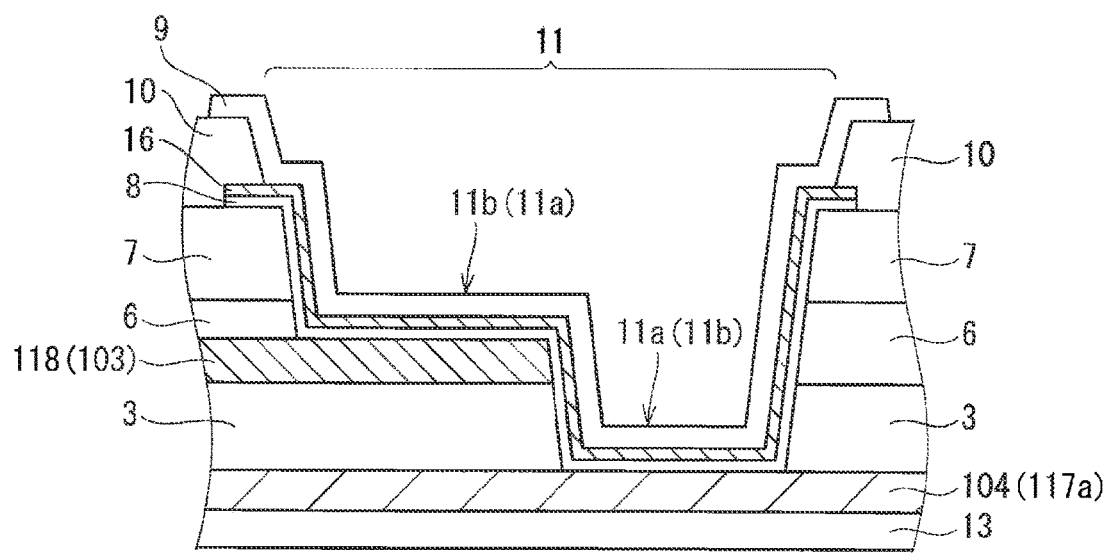
FIG. 11 is a cross-sectional view of a connection converter according to a fifth preferred embodiment.

FIG. 11 is a cross-sectional view of the connection converter 107b (or 107a) in a fifth preferred embodiment.

In the connection converters 107a, 107b in the fifth preferred embodiment, after the lower transparent conductive film 8 is formed, the conductive film 16 made of Al or the like is laminated on the lower transparent conductive film 8 by sputtering or the like. Then, the upper transparent conductive film 9 is laminated on the conductive film 16.

In the fifth preferred embodiment, when a break occurs in a step portion of the lower transparent conductive film 8, the conductive film 16 laminated on the lower transparent conductive film 8 coats the broken portion, so that sufficient electrical contact can be maintained.

<Effects>

In the array substrate 1 in the fifth preferred embodiment, the conductive film formed in the signal contact hole 11 is formed of the lower transparent conductive film 8, the conductive film 16, and the upper transparent conductive film 9 laminated in the stated order.

Therefore, when the break occurs in the step portion of the lower transparent conductive film 8 in the connection converters 107a, 107b in the fifth preferred embodiment, the conductive film 16 laminated on the lower transparent conductive film 8 coats the broken portion, so that the sufficient electrical contact can be maintained. Thus, the array substrate 1 having reliability higher than that of the array substrate 1 in the first preferred embodiment can be obtained.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. An array substrate including a display region that displays an image and a frame region that surrounds said display region, said array substrate comprising:
   a plurality of scanning lines that are formed in parallel in said display region and are extended to said frame region;
   a plurality of signal lines that are formed to intersect said plurality of scanning lines, are formed to be in parallel in said display region, and are extended to said frame region;
   a thin film transistor disposed at an intersection of each of said plurality of scanning lines and each of said plurality of signal lines;
   a first driving IC chip in said frame region and connected to the plurality of scanning lines;
   a second driving IC chip in said frame region and connected to the plurality of signal lines;
   a plurality of in-frame wires formed in said frame region;
   an insulating layer that vertically separates said scanning lines and said signal lines from said in-frame wires in said frame region; and
   a plurality of connection converters that electrically connect said scanning lines or said signal lines to said in-frame wires and are provided in said frame region, wherein
   a single contact hole that penetrates said insulating layer is formed in each of said connection converters, and each of said scanning lines or each of said signal lines is electrically connected with each of said in-frame wires through a conductive film in said single contact hole,
   said single contact hole has dimensions such that a terminal of an inspection device inspecting lines for breaks is allowed to be inserted in said single contact hole and said terminal is allowed to be in contact with said conductive film in said single contact hole,
   said connection converters do not overlap with said first and second driving IC chips in a plan view, and
   each of said scanning lines or each of said signal lines extends towards one of said connection converters in a same direction as said electrically connected in-frame wire extends away from said one connection converter.

2. The array substrate according to claim 1, wherein said single contact hole has:
   a first horizontal region in which a first bottom of said single contact hole is in contact with each of said scanning lines or each of said signal lines; and
   a second horizontal region in which a second bottom of said single contact hole is in contact with each of said in-frame wires,
   wherein a sum of an area of said first horizontal region and an area of said second horizontal region is 3000 μm$^2$ or more.

3. The array substrate according to claim 1, wherein said single contact hole has:
   a first horizontal region in which a first bottom of said single contact hole is in contact with each of said scanning lines or each of said signal lines; and
   a second horizontal region in which a second bottom of said single contact hole is in contact with each of said in-frame wires,
   wherein an area of said first horizontal region is different from an area of said second horizontal region.

4. The array substrate according to claim 3, wherein the area of said first horizontal region is larger than the area of said second horizontal region.

5. The array substrate according to claim 1, wherein said frame region includes an inspection thin-film transistor, and
   each of said in-frame wires is a wire connected with an electrode of said inspection thin-film transistor, an electrode of said first driving IC chip, or an electrode of said second driving IC chip.

6. The array substrate according to claim 1, wherein a wire formed in an upper layer among each of said scanning lines or each of said signal lines and each of said in-frame wires is formed of a semiconductor layer and a conductive film laminated in the stated order.

7. The array substrate according to claim 1, wherein a wire formed in an upper layer among each of said scanning lines or each of said signal lines and said in-frame wires is coated with a transparent conductive film.

8. The array substrate according to claim 1, wherein said conductive film formed in said signal contact hole is formed of a lower transparent conductive film, a conductive film, and an upper transparent conductive film laminated in the stated order.

9. A liquid crystal display panel, comprising:
the array substrate according to claim 1;
a color filter substrate opposed to said array substrate; and
liquid crystals held between said array substrate and said color filter substrate.

10. The array substrate according to claim 1, wherein
said plurality of connection converters include a first connection converter and a second connection converter,
said first connection converter electrically connects one of said scanning lines to a first in-frame wire of said in-frame wires,
said second connection converter electrically connects one of said signal lines to a second in-frame wire of said in-frame wires,
a first single contact hole that penetrates said insulating layer is formed in said first connection converter, and said one of said scanning lines is electrically connected with said first in-frame wire through a first conductive film in said first single contact hole, and
a second single contact hole that penetrates said insulating layer is formed in said second connection converter, and said one of said signal lines is electrically connected with said second in-frame wire through a second conductive film in said second single contact hole.

* * * * *